(12) United States Patent
Kindt

(10) Patent No.: US 6,819,170 B1
(45) Date of Patent: Nov. 16, 2004

(54) APPARATUS FOR SENSING DIFFERENTIAL VOLTAGES WITH HIGH COMMON-MODE LEVELS

(75) Inventor: Willem Johannes Kindt, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 122 days.

(21) Appl. No.: 10/327,715

(22) Filed: Dec. 20, 2002

(51) Int. Cl.[7] .................................................. G06G 7/26
(52) U.S. Cl. ...................................... 327/563; 330/258
(58) Field of Search ................................ 327/560–563, 327/565, 51, 52, 56; 330/258, 146

(56) References Cited

U.S. PATENT DOCUMENTS

| | | | | |
|---|---|---|---|---|
| 5,499,526 A | * | 3/1996 | Muro | 73/1.38 |
| 5,631,602 A | * | 5/1997 | Kearney et al. | 330/2 |
| 6,198,350 B1 | * | 3/2001 | Zarabadi | 330/297 |
| 6,380,807 B1 | | 4/2002 | Brokaw | 330/258 |
| 6,727,757 B1 | * | 4/2004 | Venkatraman et al. | 330/259 |

OTHER PUBLICATIONS

"High Common–Mode Voltage, Single–Supply Difference Amplifier AD8200," *Analog Devices, Inc.*, 2002, pp. 1–8.

* cited by examiner

Primary Examiner—Timothy P. Callahan
Assistant Examiner—Cassandra Cox
(74) Attorney, Agent, or Firm—Brett A. Hertzberg; Merchant & Gould

(57) ABSTRACT

A differential voltage amplifier includes a dynamic level shifter circuit and an amplifier circuit. The dynamic level shifter circuit includes high-impedance current sources and resistors that are arranged to move the common-mode levels of a differential input signal to a signal level that is suitable for the amplifier circuit. The amplifier circuit may be single-ended or differential. The dynamic level shifter circuit may include one or more current sources that are arranged to provide improved performance for low common-mode levels. A dynamic biasing scheme may be employed to improve operation over varied common-mode ranges. A trimming circuit may be used to adjust offsets in the system. A DC chop arrangement may be employed to remove offsets in the system.

20 Claims, 7 Drawing Sheets

APPARATUS FOR SENSING DIFFERENTIAL VOLTAGES WITH HIGH COMMON-MODE LEVELS

FIELD OF THE INVENTION

The present invention is generally related to circuits that sense differential signals with high common-mode voltage. More particularly, the present invention is related to an apparatus for sensing differential voltages with high common-mode levels such that noise, offset, and drift effects in the resulting circuit are minimized.

BACKGROUND OF THE INVENTION

A schematic diagram of a conventional dynamic bridge amplifier (100) is illustrated in FIG. 1. The dynamic bridge amplifier includes five resistors (R10–R14) and an operational amplifier (A1).

Resistor R1 is connected between V1 and node N1. Resistor R1' is connected between V2 and node N2. Resistor R2 is connected between node N1 and GND. Resistor R2' is connected between node N2 and GND. Resistor R3 is connected between node N2 and VO. Operational amplifier A1 includes a non-inverting input terminal that is connected to node N1, an inverting input terminal that is connected to node N2, and an output that is connected to VO.

In operation, an input signal is applied across the V1 and V2 terminals, and an output signal is provided at the VO terminal. The signal includes a common-mode portion (VCM) and a differential portion (VDIFF). The differential portion is a small signal, while the common-mode portion may be rather large. The signal levels are given by: V1=VCM−VDIFF/2 and V2=VCM+VDIFF/2.

R1 is large compared to R2 such that the common-mode voltages that are seen by the inputs of the operational amplifier (A1) are reduced. Amplifier A1 drives a signal into the VO terminal until the voltage at node N1 and N2 are equal. The transfer function that is associated with circuit 100 can be described by the following equation: VO/VDIFF=−(1/2R1)*{R3[1+R2/R2']+R2}. When resistors R3 and R2 have an equivalent parallel resistance as given by R3//R2'=R2, the transfer function may be simplified as: VO/VDIFF=−R3/R1.

SUMMARY OF THE INVENTION

Briefly stated, the present invention is related to a differential voltage amplifier that includes a dynamic level shifter circuit and an amplifier circuit. The dynamic level shifter circuit includes high-impedance current sources and resistors that move the common-mode levels of a differential input signal to a signal level that is suitable for the amplifier circuit. The amplifier circuit may be single-ended or differential. The dynamic level shifter circuit may include one or more additional current sources that are arranged to provide improved performance for low common-mode levels. A dynamic biasing scheme may be employed to improve operation over varied common-mode ranges. A trimming circuit may be used to adjust offsets in the system. A DC chop arrangement may be employed to remove offsets in the system.

A more complete appreciation of the present invention and its improvements can be obtained by reference to the accompanying drawings, which are briefly summarized below, the following detail description of presently preferred embodiments of the invention, and the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention is generally related to an apparatus for sensing differential voltages with high common-mode levels such that noise, offset, and drift effects in the resulting circuit are minimized. An example apparatus includes a dynamic level shifter circuit and an amplifier that may be single-ended or differential. The dynamic level shifter circuit includes high-impedance current sources that are arranged to move the common-mode levels of a differential input signal to a signal level that is suitable for the amplifier circuit. The dynamic level shifter circuit arrangement may include one or more additional current sources that are arranged to provide improved performance for low common-mode levels. A dynamic biasing scheme may be employed to improve operation over varied common-mode ranges. A trimming circuit may be used to adjust offsets in the system. A DC chop arrangement may be employed to remove offsets in the system.

FIRST EXAMPLE

Amplifier with Dynamic Level Shifter

Figure 2:
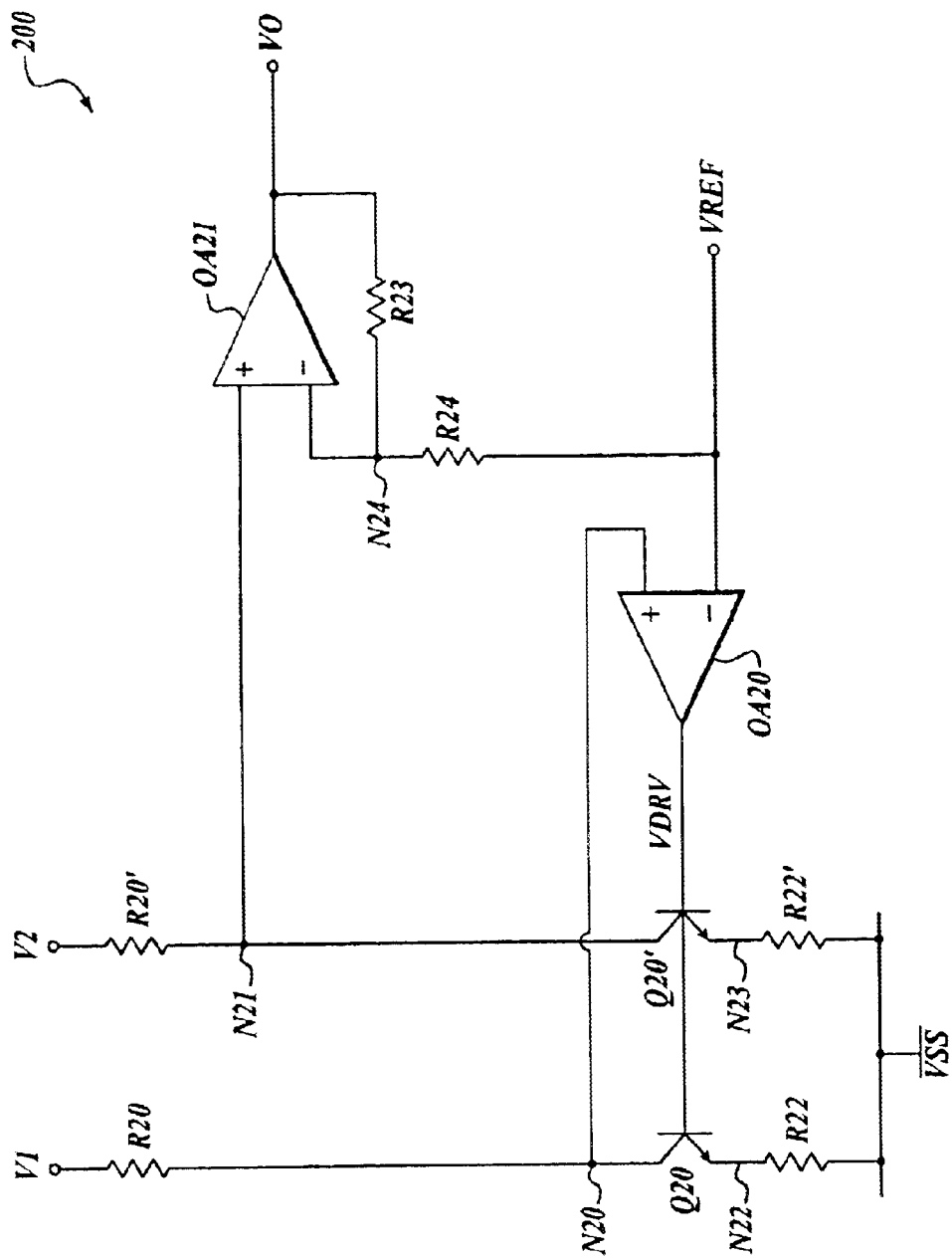
FIG. 2 is a schematic diagram of a differential amplifier circuit that includes dynamic level shifting in accordance with the present invention.

FIG. 2 is a schematic diagram of a differential amplifier circuit (200) that includes dynamic level shifting in accordance with the present invention. Differential amplifier circuit 200 includes two operational amplifiers (OA20, OA21), two transistors (Q20, Q20'), and six resistors (R20, R20', R22, R22', R23, R24).

Operational amplifier OA20 includes a non-inverting input that is coupled to node N20, an inverting input that is coupled to VREF, and an output that is coupled to VDRV. Operational amplifier OA21 includes a non-inverting input that is coupled to node N21, an inverting input that is coupled to node N24, and an output that is coupled to VO. Transistor Q20 includes a collector that is coupled to node N20, a base that is coupled to VDRV, and an emitter that is coupled to node N22. Transistor Q20' includes a collector that is coupled to node N21, a base that is coupled to VDRV, and an emitter that is coupled to node N23. Resistor R20 is coupled between V1 and node N20. Resistor R20' is coupled between V2 and node N21. Resistor R22 is coupled between node N22 and VSS. Resistor R22' is coupled between node N23 and VSS. Resistor R23 is coupled between VO and node N24. Resistor R24 is coupled between VREF and node N24.

In operation, an input signal is applied to the V1 and V2 terminals. The input signal includes a common-mode portion (VCM) and a differential portion (VDIFF). The voltages associated with the input signal at the V1 and V2 terminals is given by: V1=VCM−VDIFF/2 and V2=VCM+VDIFF/2. The common-mode portion of the signal (VCM) may have a very high voltage relative to the breakdown voltages associated with an integrated circuit based solution. Resistors R20 and R20' isolate the common-mode voltage (VCM) from the inputs of amplifier OA21. Operational amplifier OA20 is arranged to provide a drive signal (VDRV) to the base of transistor Q20 such that the voltage associated with node N20 is maintained at the same potential as VREF.

The voltage associated with node N21 corresponds to VREF+VDIFF such that the common-mode voltage (VCM) associated with the input signal is isolated from the input of amplifier OA21. Amplifier OA21 is configured as a non-inverting amplifier that has a gain that is determined by resistors R23 and R24. In other words, the output signal (VO) is given by: VO=VDIFF(1+R23/R24). Transistors Q20 and Q20' are operated as matched current sources that are controlled by drive signal VDRV. The current sources have a high source-impedance. Resistors R22 and R22' are optional emitter degeneration resistors that minimize noise and offset that is introduced by transistors Q20 and Q20', respectively.

Figure 1:
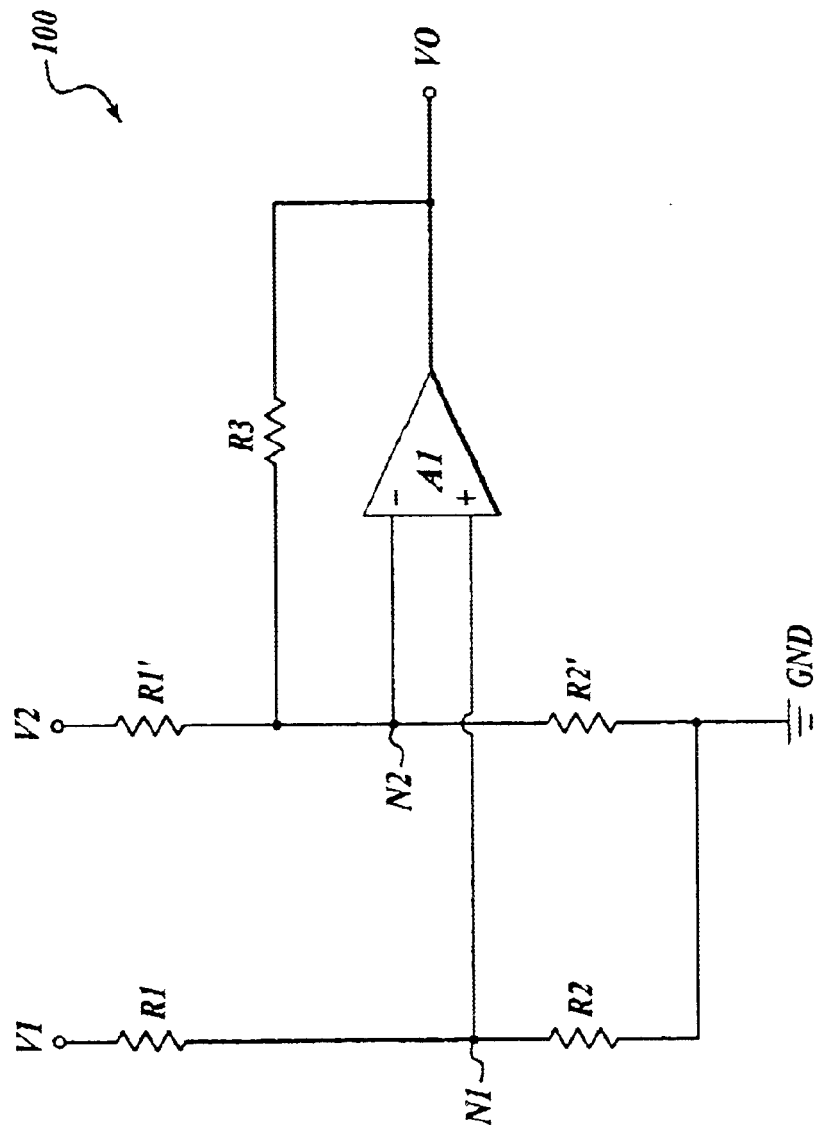
FIG. 1 is a schematic diagram of a conventional dynamic bridge amplifier circuit.

The present invention has improved performance characteristics when compared to the conventional dynamic bridge amplifier. For example, the operational amplifier (A1) that is illustrated in FIG. 1 is responsive to the signals at nodes N1 and N2. The voltage associated with node N1 corresponds to V1*R2/(R1+R2), where V1 corresponds to VCM−VDIFF/2. Thus, the voltage at node N1 is determined by; VCM/(1+R1/R2)−VDIFF/{2*(1+R1/R2)}. As illustrated above, the resistor divider formed by R1 and R2 attenuates the differential signal (VDIFF) at node N1. In contrast, the full differential signal (VDIFF) appears at node N20 in the present invention.

The performance of amplifier A1 from circuit 100 is exasperated by the dynamic bridge arrangement illustrated in FIG. 1. For example, resistors R1 and R2 typically have a ratio of 20:1 such that a maximum common-mode voltage (VCM) of 60V is reduced to 3V at the input of amplifier A1. A non-ideal version of amplifier A1 includes offset voltage and drift characteristics that are unavoidable. The noise in the amplifier is gained-up by the divider ratio. Thus, for a minimum input offset specification of 1 mV, amplifier A1 must have an offset that is below 1 mV/20=50 uV. In contrast, the high source-impedance of the current sources do not gain-up the noise from the amplifier in the present invention.

Dynamic matching is easier to implement in the present invention when compared to the conventional dynamic bridge arrangement illustrated in FIG. 1. Dynamic matching may be implemented with the present invention by chopping the common-mode signal processing circuitry (e.g., the current sources that are formed with transistors Q20 and Q20') with one or more clock signals. The present invention includes an offset and 1/f noise characteristic that can be cancelled by chopping the common-mode signal processing circuitry without chopping the differential signal path (e.g., see FIG. 6 and related discussion).

SECOND EXAMPLE

Amplifier with Dynamic Level Shifter

Figure 3:
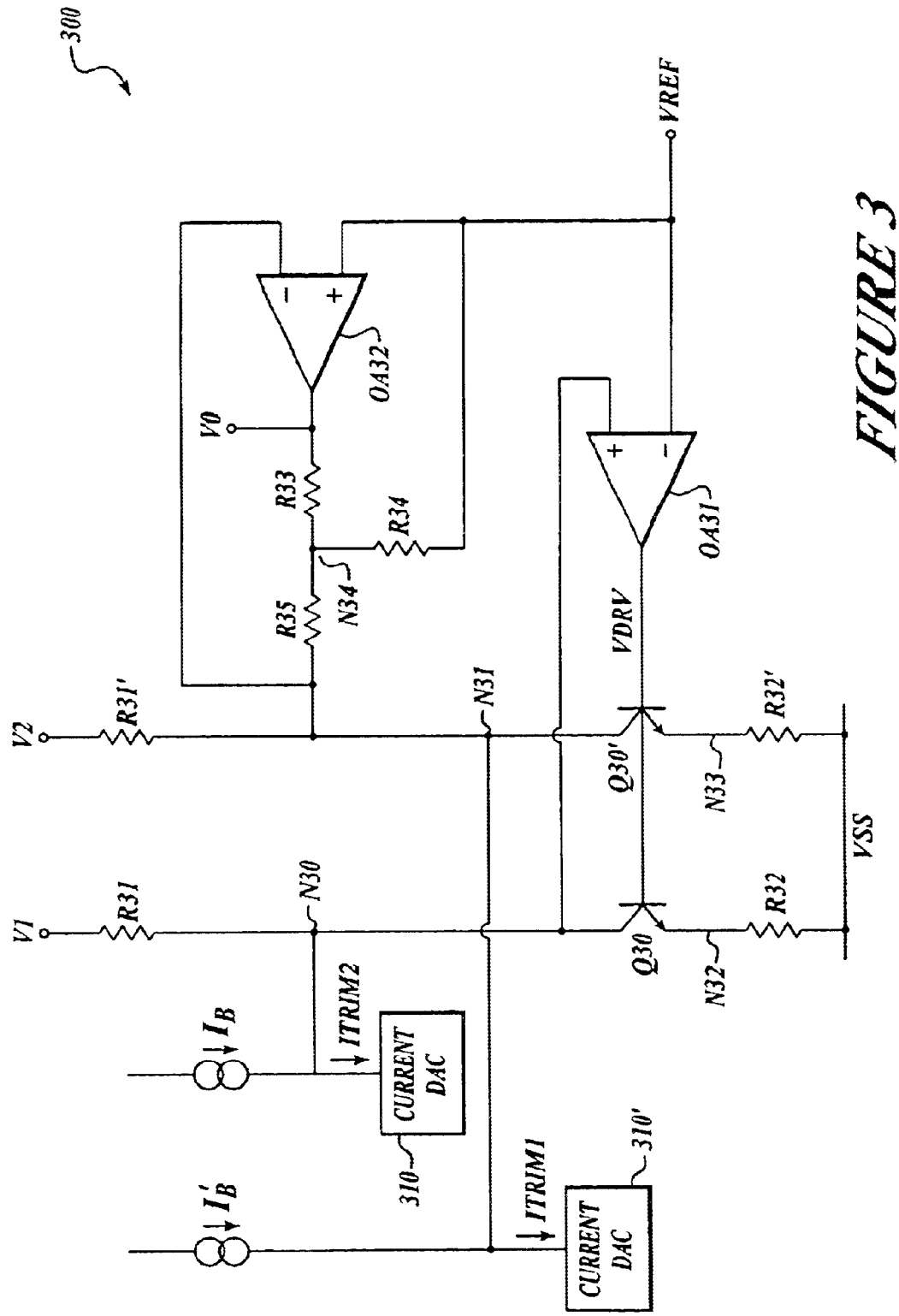
FIG. 3 is a schematic diagram of another differential amplifier circuit that includes dynamic level shifting in accordance with the present invention.

FIG. 3 is a schematic diagram of another differential amplifier circuit (300) that includes dynamic level shifting in accordance with the present invention. Differential amplifier circuit 300 includes two operational amplifiers (OA31, OA32), two transistors (Q30, Q30'), seven resistors (R31, R31', R32, R32', R33, R34, R35), two current sources (IB, IB'), and two optional trim adjustment circuits (310, 310').

Operational amplifier OA31 includes a non-inverting input that is coupled to node N30, an inverting input that is coupled to VREF, and an output that is coupled to VDRV. Operational amplifier OA32 includes a non-inverting input that is coupled to VREF, an inverting input that is coupled to node N31, and an output that is coupled to VO. Transistor Q20 includes a collector that is coupled to node N30, a base that is coupled to VDRV, and an emitter that is coupled to node N32. Transistor Q30' includes a collector that is coupled to node N31, a base that is coupled to VDRV, and an emitter that is coupled to node N33. Resistor R31 is coupled between V1 and node N30. Resistor R-31' is coupled between V2 and node N31. Resistor R32 is coupled between node N32 and VSS. Resistor R32' is coupled between node N33 and VSS. Resistor R33 is coupled between VO and node N34. Resistor R34 is coupled between VREF and node N34. Resistor R35 is coupled between node N31 and node N34. Current source IB is coupled to node N30. Current source IB' is coupled to node N31. Trim adjustment circuits 310 and 310' are coupled to nodes N30 and N31, respectively.

Differential amplifier circuit 300 is substantially similar in operation to differential amplifier circuit 200. However, amplifier OA32 and resistors R23 and R24 are replaced by a different feedback network configuration as represented by amplifier OA32 and resistors R33–R35. Resistors R33–R35 are configured as a T-network to avoid the use of a large resistor.

Current sources IB and IB' are provided to improve matching between transistors Q30 and Q30' when the common-mode input voltage (VCM) is low. The current through Q30 depends on the common-mode input voltage (VCM) and the value of R31 as: I30=(VCM−VREF)/R31. Without the current sources (IB, IB'), current I30 is very low when the common-mode input voltage (VCM) is low (e.g., close to or less than VREF). The current sources (IB, IB') are arranged to increase the bias voltages across resistors R32 and R32'. Resistors R32 and R32' are referred to as emitter degeneration resistors. Matching between the output currents from the current sources that include transistors (Q30, Q30') is improved by the current sources (IB, IB') when the voltages across resistors R32 and R32' are large when compared to the thermal voltage (kT/q). The current sources also ensure that the circuit operates when the common-mode input voltage drops below the ground level.

The dynamic level shifter circuit includes two circuit branches that are matched with respect to one another. One branch includes resistor R31, transistor Q30, and resistor R32, while the other branch includes resistor R31', transistor Q30', and resistor R32'. An increased offset and a decreased CMRR will occur in the overall circuit (300) when a mismatch occurs between matched components in the two branches of the circuit.

The common-mode rejection ratio (CMRR) for circuit 300 is a figure of merit that demonstrates the circuit's ability to reject changes in the common-mode voltage. The CMRR can be expressed in dB as the inverse of the derivative of offset voltage to input common-mode voltage 1/(dVOS/dVCM). Mismatches in the operation of the two circuit branches that occur over the common-mode input range of the circuit will result in poor CMRR, since the change in common-mode voltage results in offset voltages in the output signal (or signals). It can be shown that the offset voltage (VOS) in circuit 300 is given by: VOS=A*dZ/Z+B*(VCM−VREF)*dZ/Z. dZ/Z is a term that corresponds to the mismatch between matched component in both circuit branches. A and B are constants that depends on the conditions in the circuit including bias voltages and/or currents in the circuit. The first term (A*dZ/Z) is common-mode independent, while the second term (B*(VCM−VREF)*dZ/Z) is common-mode dependent. In one example, the mismatch between components will result in only a common-mode independent offset (e.g., B=0). In another example, the mismatch between components will result in only a common-mode dependent offset (e.g., A=0).

Figure 4:
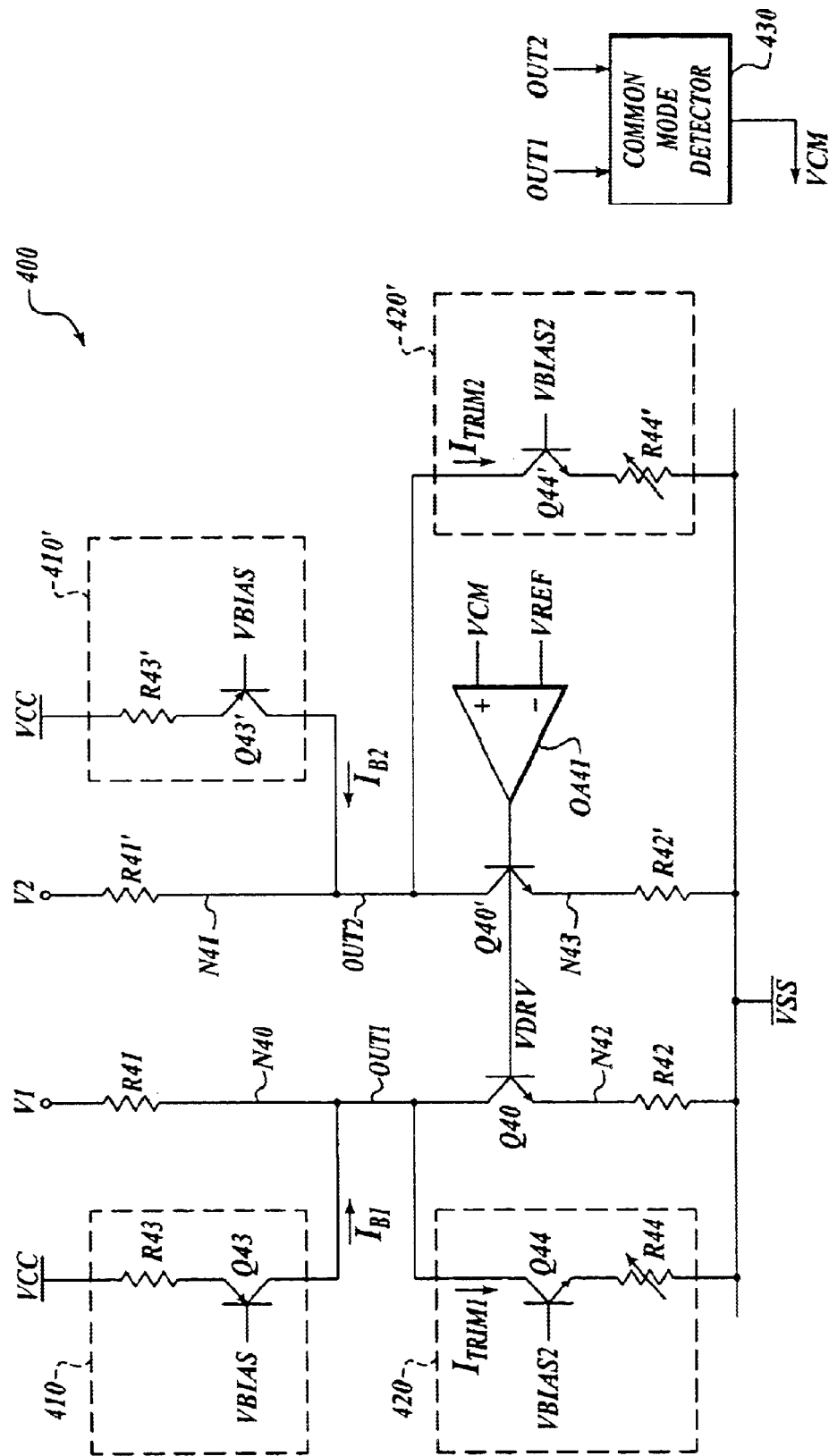
FIG. 4 is a schematic diagram of still another differential amplifier circuit that includes dynamic level shifting in accordance with the present invention.

An example of mismatching in a component is illustrated with respect to resistors R32 and R32' in FIG. 3 (the same holds for R22, R22' in FIG. 2, and R42, R42' in FIG. 4). The offset from a mismatch between resistors R32 and R32' is in the form of: VOS=A*R/dR+B*(VCM−VREF)*dR/R. Another example of mismatching in a component is illustrated with respect to resistors R31 and R31' (the same holds for resistors R20, R20' in FIG. 2, and R41, R41' in FIG. 4). The offset from a mismatch between resistors R31 and R31' is given in the form of: VOS=B*(VCM−VREF)*dR/R (notice that A=0 in this case).

The trim adjustment circuits (310, 310') are optional circuits. The trim adjustment circuits (310, 310') are arranged to provide trim currents (ITRIM1, ITRIM2) to nodes N30 and N31, respectively. The trim currents adjust the offsets in circuit 300 that are common-mode independent (e.g., A*dZ/Z term is counteracted by the trim adjustment circuit). In one example, each trim adjustment circuit is a current output digital-to-analog converter (current DAC) that is configured to provide an output current to the respective node. The current DAC operates similar to an adjustable current source. Separate trim adjustment circuits can be coupled to nodes N30 and N31 for high-end performance, while a single trim adjustment circuit may be sufficient for lower-end performance.

The matching between resistors can be adjusted to counteract the offset effects that are common-mode dependent (e.g, the B*(VCM−VREF)*dZ/Z term). In one example, at least one of resistors R31 and R31' is adjusted in value to trim a common-mode related offset. In another example, at least one of resistors R32 and R32' is adjusted in value to trim a common-mode related offset Resistor values may be adjusted by any appropriate means including but not limited to: laser trimming by shaving resistive material, and series and/or parallel resistors with programmable links or fuse selected links.

THIRD EXAMPLE

Amplifier with Dynamic Level Shifter

FIG. 4 is a schematic diagram of still another differential amplifier circuit (400) that includes dynamic level shifting in accordance with the present invention. Differential amplifier circuit 400 includes an operational amplifier (OA41), two transistors (Q40, Q40'), four resistors (R41, R41', R42, R42'), two current sources (410, 410'), and two trim adjustment circuits (420, 420').

Operational amplifier OA41 includes a non-inverting input that is coupled to VREF, an inverting input that is coupled to VCM, and an output that is coupled to VDRV. Transistor Q40 includes a collector that is coupled to node N40, a base that is coupled to VDRV, and an emitter that is coupled to node N42. Transistor Q40' includes a collector that is coupled to node N41, a base that is coupled to VDRV, and an emitter that is coupled to node N43. Resistor R41 is coupled between V1 and node N40. Resistor R41' is coupled between V2 and node N41. Resistor R42 is coupled between node N42 and VSS. Resistor R42' is coupled between node N43 and VSS. Current source 410 is coupled to node N40. Current source 410' is coupled to node N41. Trim adjustment circuit 420 is coupled to node N40. Trim adjustment circuit 420' is coupled to node N41.

Differential amplifier circuit 400 is substantially similar in operation to differential amplifier circuits 200 and 300. However, further details of example current sources (410, 410') and example trim adjustment circuits (420, 420') are also illustrated in FIG. 4. Moreover, amplifier OA41 in FIG. 4 is operated with a common-mode voltage that is provided as VCM from a common-mode detector circuit (430), which senses the signal levels of OUT1 and OUT2.

Current sources 410 and 410' are substantially matched to one another. An example current source includes a transistor (Q43) and a resistor (R43). Resistor R43 is coupled between VCC and the emitter of transistor Q43. Transistor Q43 includes a base that is configured to receive a bias signal (VBIAS), and a collector that is arranged to operate as an output of the current source. Current source 410 is configured to provide current IB1 to node N40, while current source 410' is configured to provide current IB2 to node N41.

Trim adjustment circuits 420 and 420' are substantially matched to one another. The trim adjustment circuits (420, 420') are arranged to provide trim currents (ITRIM1, ITRIM2) to nodes N40 and N31, respectively. The trim adjustment circuit is arranged to adjust offsets in circuit 400. In one example, each trim adjustment circuit is a biased current source that includes a transistor (Q44) and an adjustable resistor (R44). Transistor Q44 includes a collector that is arranged as an output of the trim adjustment circuit, a base that is biased by another bias signal (VBIAS2) and an emitter that is series coupled to VSS via adjustable resistor R44. The trim current is adjusted by adjusting the resistance of R44.

Common-mode detector circuit 430 is arranged to detect the common mode level that is associated with nodes N40 and N41. In one example, the common-mode detector circuit corresponds to a pair of resistors that are series connected between OUT1 and OUT2 such that the center-tap between the two resistors corresponds to VCM. In another example, VCM may be simply connected to one of the outputs (OUT1, OUT2). The choice of the common-mode detector circuit depends largely on whether a single-ended or differential output is desired.

Figure 5:
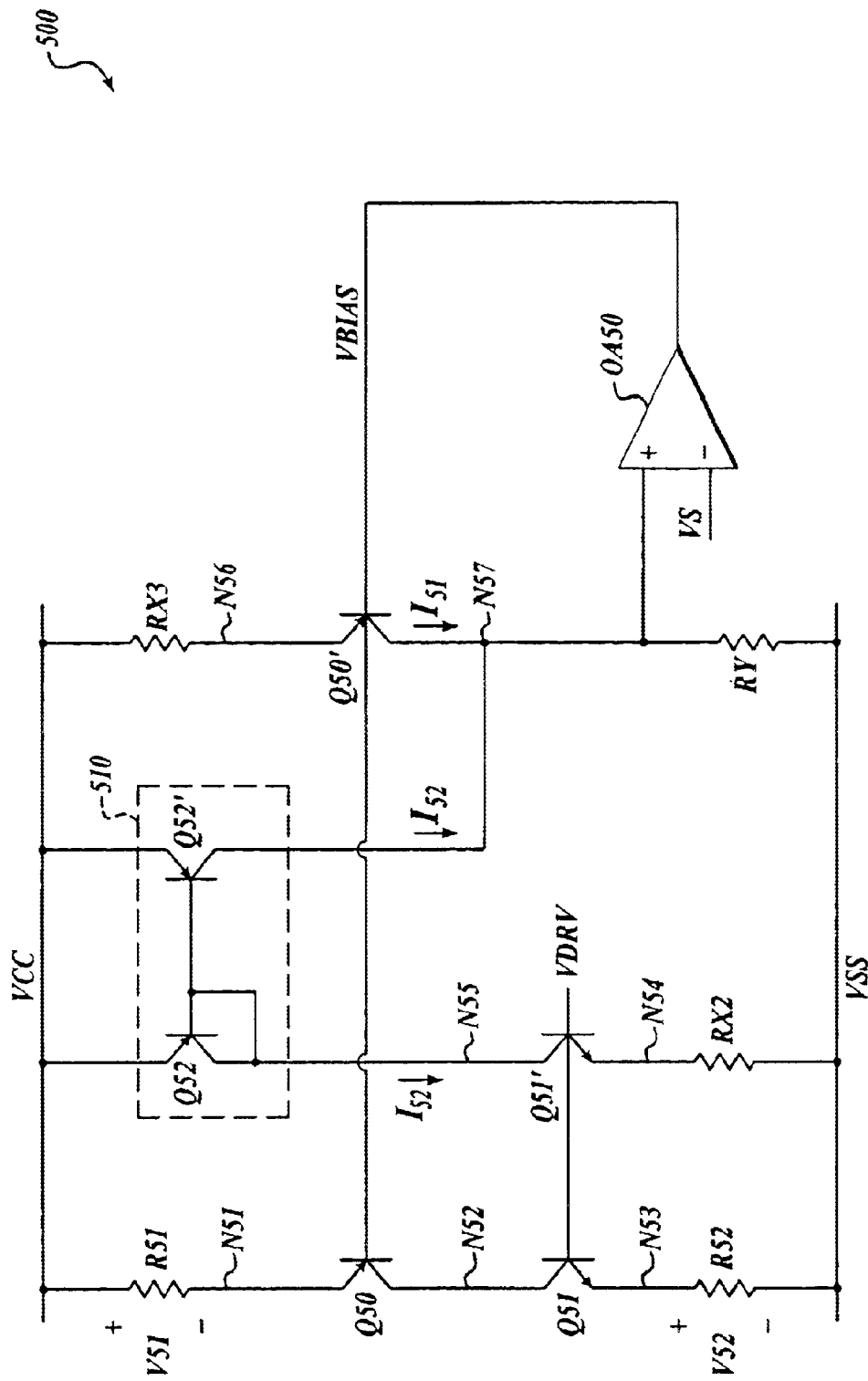
FIG. 5 is a schematic diagram of a bias generator circuit that is arranged in accordance with the present invention.

FIG. 5 is a schematic diagram of a bias generator circuit (500) that is arranged in accordance with the present invention. Bias generator 500 includes four transistors (Q50, Q50', Q51, Q51'), five resistors (R51, R52, RX2, RX3, RY), a current mirror circuit (510), and an operational amplifier (OA50).

Transistor Q50 includes a collector that is coupled to node N52, a base that is coupled to VBIAS, and an emitter that is coupled to node N61. Transistor Q50' includes a collector that is coupled to node N57, a base that is coupled to VBIAS, and an emitter that is coupled to node N56. Transistor Q51 includes a collector that is coupled to node N52, a base that is coupled to VDRV, and an emitter that is coupled to node N53. Transistor Q51' includes a collector that is coupled to node N55, a base that is coupled to VDRV, and an emitter that is coupled to node N54. Resistor R51 is coupled between VCC and node N51. Resistor R52 is coupled between node N53 and VSS. Resistor RX12 is coupled between node N54 and VSS. Resistor RX3 is coupled between VCC and node N56. Resistor RY is coupled between node N57 and VSS. Current mirror circuit 510 is coupled between node N55 and node N57. Operational amplifier OA50 includes a non-inverting input that is coupled to node N57, an inverting input that is coupled to VS, and an output that is coupled to VBIAS.

The current mirror circuit may be any appropriate current mirror that provides a current to node N57 in response to a signal at node N55. In one example, current mirror circuit 510 included transistors Q52 and Q52'. Transistor Q52 includes a collector and base that are coupled to node N55, and an emitter that is coupled to VCC. Transistor Q52' includes a collector that is coupled to node N57, a base that is coupled to node N55, and an emitter that is coupled to VCC.

Bias generator circuit 500 is arranged to provide a bias current that depends on the common-mode level as sensed by the drive signal (VDRV). Transistor Q51' copies the voltage (V52) across resistor R52 to resistor RX2, converting this voltage to a current (I52). Current I52 is reflected through the current mirror circuit (510) and coupled to resistor RY. Transistor Q50' copies the voltage across resistor R51, converting this voltage to another current (I51). Current I51 is coupled to resistor RY. The voltage across resistor RY corresponds to the weighed sum of V51 and V52. Operational amplifier OA50 compares the weighed sum to a reference signal (VS) and generates a bias voltage (VBIAS) so that the weighed sum is equal to VS. A stable operating condition for VBIAS is found when V51=VS*RX3/RY−V52*RX3/RX2. V51 is inversely proportional to V52 with a specified offset.

When bias generator circuit 500 is employed, current sources 410 and 410' are arranged to provide biasing currents that are dependent on the common-mode voltage. The variable bias current is arranged to ensure that transistors Q40 and Q40' are matched over all common-mode operating ranges. For example, when the common-mode voltage is low, transistor Q43 is biased to maintain a higher biasing current into transistor Q40 to reduce the sensitivity of the circuit to mismatches in Q40 and Q40'. When the common-mode voltage is high, transistor Q43 is biased to maintain a lower biasing current into transistor Q40 so that transistor Q40 is maintained out of saturation.

FOURTH EXAMPLE

Fully Differential Amplifier with Dynamic Level Shifting

Figure 6:
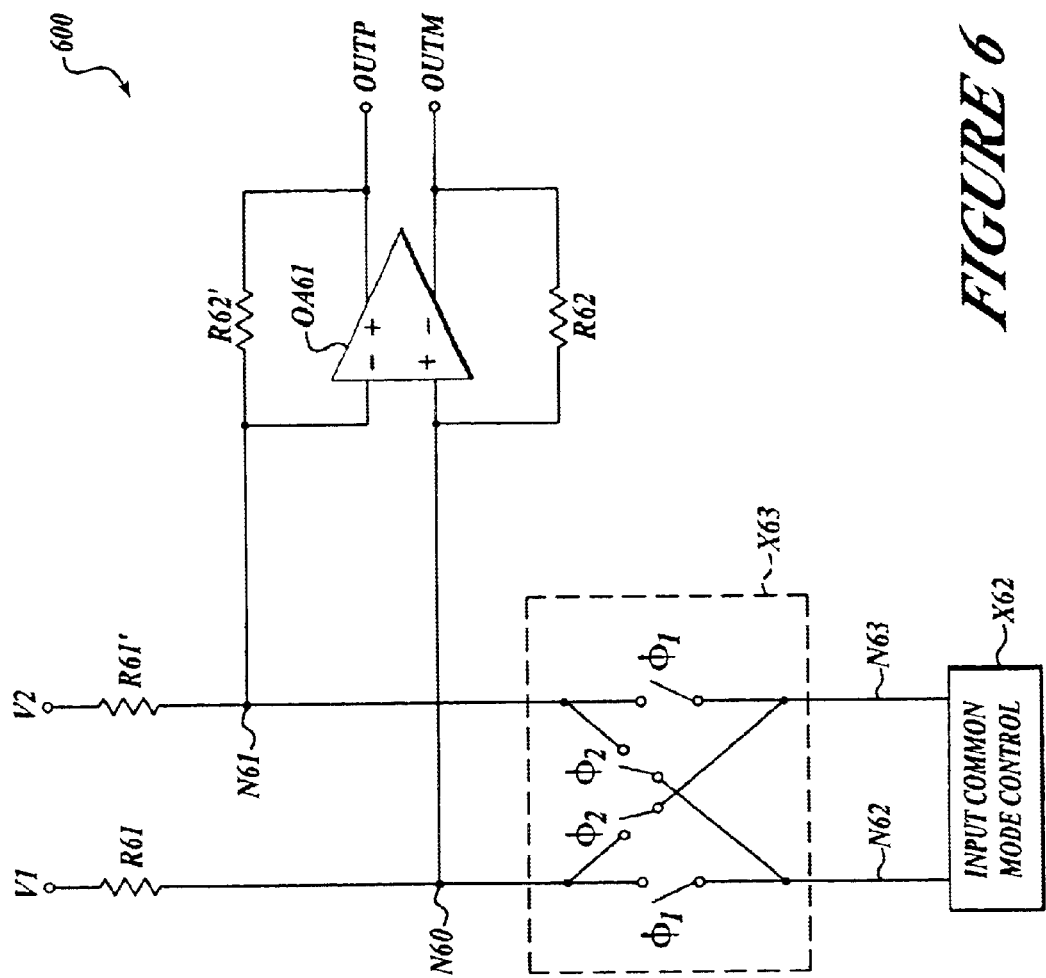
FIG. 6 is a schematic diagram of yet another differential amplifier circuit that includes dynamic level shifting in accordance with the present invention.

FIG. 6 is a schematic diagram of yet another differential amplifier circuit (600) that includes dynamic level shifting in accordance with the present invention. Differential amplifier circuit 600 includes a differential amplifier (DA61), four resistors (R61, R61', R62, R62'), an input common-mode control circuit (X62), and a switching circuit (X63). The common-mode control circuit (X62) may be implemented as the circuit illustrated in FIG. 4, without resistors R41 and R41'.

Differential amplifier DA61 includes a non-inverting input that is coupled to node N60, an inverting input that is coupled to node N61, a non-inverting output that is coupled to OUTP, and an inverting output that is coupled to OUTM. Resistor R61 is coupled between V1 and node N60. Resistor R61' is coupled between V2 and node N61. Resistor R62 is coupled between node N60 and OUTM. Resistor R62' is coupled between node N61 and OUTP. Input common-mode control circuit X62 is coupled to nodes N62 and N63. Switching circuit X63 is coupled to nodes N60, N61, N62, and N63.

Differential amplifier DA71 is arranged to provide a differential output signal to OUTP and OUTM in response to the signals sensed from nodes N60 and N61. The overall gain of the differential output signal is determined by the ratio of R62:R61. Switching circuit X63 is arranged to chop the signals according to two phases ($\phi1$, $\phi2$). In the first phase ($\phi1$), node N63 is coupled to node N61, and node N62 is coupled to node N60. In the second phase ($\phi2$), node N63 is coupled to node N60, and node N62 is coupled to node N61. By chopping the operation of the bridge amplifier (600), offset errors in the dynamic level shift circuits that are caused by various mismatches are moved from DC frequency ranges to the frequency of the system clocks ($\phi1$, $\phi2$). A low pass filter may be coupled to the output to remove these frequency translated offset errors.

FIFTH EXAMPLE

Fully Differential Amplifier with Dynamic Level Shifting

Figure 7:
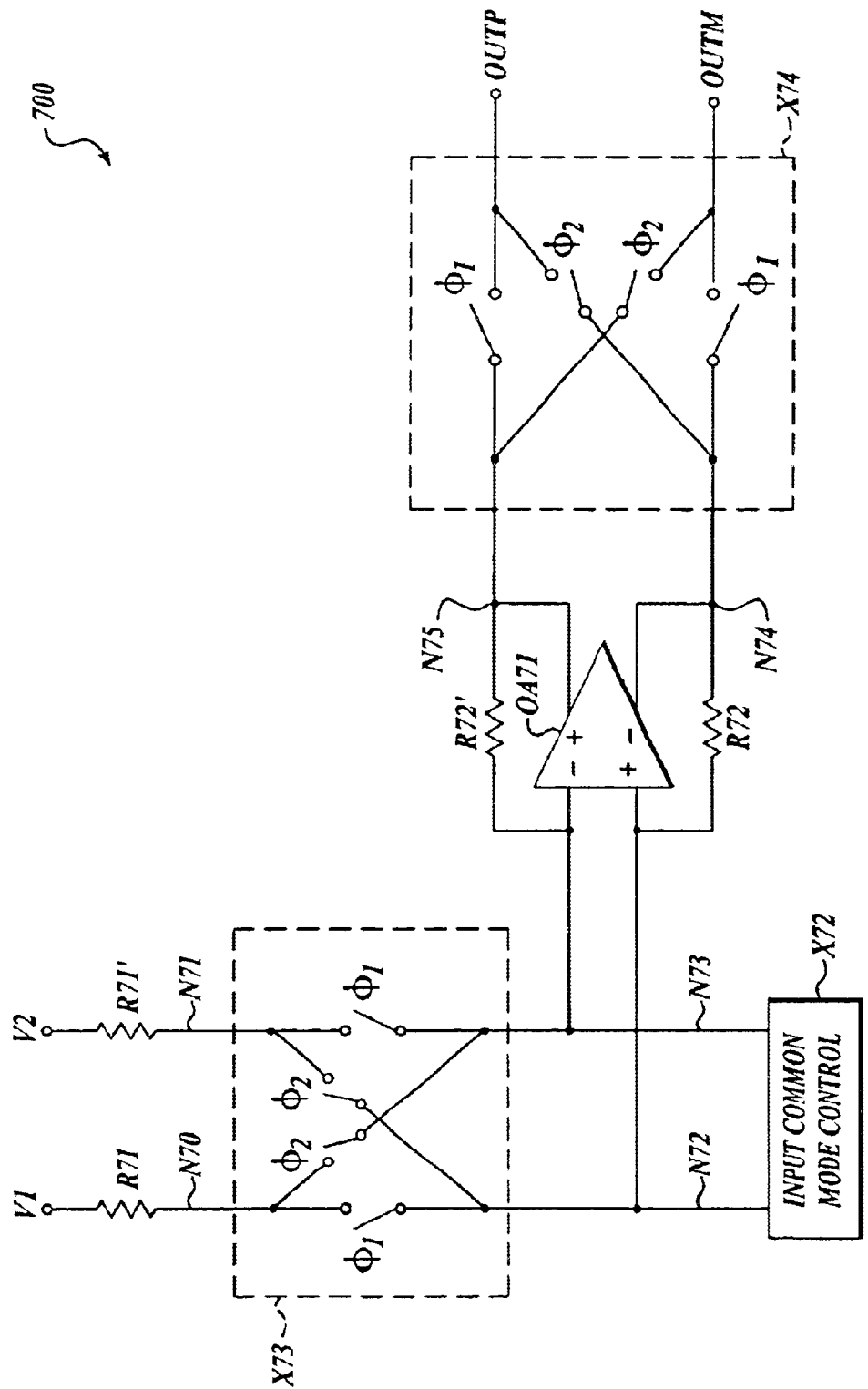
FIG. 7 is a schematic diagram of still yet another differential amplifier circuit that includes dynamic level shifting in accordance with the present invention.

FIG. 7 is a schematic diagram of still yet another differential amplifier circuit (700) that includes dynamic level shifting in accordance with the present invention. Differential amplifier circuit 700 includes a differential amplifier (DA71), four resistors (R71, R71', R72, R72'), an input common-mode control circuit (X72), and two switching circuits (X73, X74). The common-mode control circuit (X72) may be implemented as the circuit illustrated in FIG. 4, without resistors R41 and R41'.

Differential amplifier DA71 includes a non-inverting input that is coupled to node N72, an inverting input that is coupled to node N73, a non-inverting output that is coupled to node N75, and an inverting output that is coupled to node N74. Resistor R71 is coupled between V1 and node N70. Resistor R71' is coupled between V2 and node N71. Resistor R72 is coupled between node N72 and node N74. Resistor R72' is coupled between node N73 and node N75. Input common-mode control circuit X72 is coupled to nodes N72 and N73. Switching circuit X73 is coupled to nodes N70, N71, N72, and N73. Switching circuit X74 is coupled to node N74, node N75, OUTP and OUTM.

Differential amplifier DA71 is arranged to provide a differential output signal to OUTP and OUTM in response to the signals sensed from nodes N72 and N73. The overall gain of the differential output signal is determined by the ratio of R72:R71. Switching circuit X73 is arranged to chop the signals in the differential amplifier according to two phases ($\phi1$, $\phi2$). In the first phase ($\phi1$), node N72 is coupled to node N70, and node N73 is coupled to node N71. In the second phase ($\phi2$), node N72 is coupled to node N71, and node N73 is coupled to node N70. By chopping the operation of the bridge amplifier (700), offset errors in the dynamic level shift circuits that are caused by various mismatches are moved from DC frequency ranges to the frequency of the system clocks ($\phi 1$, $\phi 2$).

The chopping operation of switching circuit X73 also chops the inputs to the differential amplifier (DA71). Switching circuit X74 is arranged to chop the signals from the differential amplifier (DA71) according to two phases ($\phi 1$, $\phi 2$). In the first phase ($\phi 1$), node N75 is coupled to OUTP, and node N74 is coupled to OUTM. In the second phase ($\phi 2$), node N75 is coupled to OUTM, and node N74 is coupled to OUTP. The combined operation of switching circuits X73 and X74 moves offset errors in differential amplifier DA71 from DC frequency ranges to the frequency of the system clocks ($\phi 1$, $\phi 2$). A simple low pass filter may be coupled to the output to remove these frequency translated offset errors.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus that is arranged to provide an amplified signal in response to a differential input signal that is provided across first and second input terminals, comprising:
   a first resistor that is coupled between the first input terminal and a first node;
   a second resistor that is coupled between the second input terminal and a second node;
   a first current source that is coupled between the first node and a power supply, wherein the first current source is configured to respond to a drive signal;
   a second current source that is coupled between the second node and a power supply, wherein the second current source is configured to respond to the drive signal;
   a first amplifier circuit that is arranged to provide the drive signal in response to a common-mode sense signal, wherein the common-mode sense signal is associated with a common-mode portion of the differential input signal; and
   a second amplifier circuit that is coupled to at least one of the first and second node, wherein the second amplifier circuit is arranged to provide the amplified output signal.

2. The apparatus of claim 1, wherein the each of the first and second current sources include a transistor that is biased by the drive signal, and a degenerating resistor that is coupled to the transistor, wherein the transistors and degenerating resistors are arranged such that output currents in the first and second current sources are closely matched.

3. The apparatus of claim 1, wherein the first amplifier circuit includes a non-inverting input that is coupled to one of the first and second nodes, and an inverting input that is coupled to the reference signal.

4. The apparatus of claim 3, wherein the second amplifier circuit is configured as a non-inverting amplifier with a non-inverting input that is coupled to the other of the first and second nodes, and an inverting input that is coupled to the reference signal through a feedback network.

5. The apparatus of claim 3, wherein the second amplifier circuit is configured as an inverting amplifier with an inverting input that is coupled to the other of the first and second nodes, and a non-inverting input that is coupled to the reference signal.

6. The apparatus of claim 1, further comprising a third current source that is coupled to the first node, and fourth current source that is coupled to the second node, wherein the third and fourth current sources are arranged to provide biasing currents when the differential input signal is low.

7. The apparatus of claim 1, further comprising a third current source that is coupled to the first node, and fourth current source that is coupled to the second node, wherein the third and fourth current sources are arranged to provide biasing currents that are inversely proportional to a common-mode level associated with the differential input signal.

8. The apparatus of claim 7, further comprising a dynamic biasing circuit that is arranged to bias the third and fourth current sources in response to the drive signal.

9. The apparatus of claim 1, further comprising a trim adjustment circuit that is coupled to at least one of the first and second nodes, wherein the trim adjustment circuit is arranged to compensate for matching errors in the apparatus.

10. The apparatus of claim 9, wherein the trim adjustment circuit corresponds to at least one of an adjustable current source circuit and a current DAC.

11. The apparatus of claim 1, wherein the first amplifier circuit includes a non-inverting input that is coupled to a sensed common mode signal and an inverting input that is coupled to a reference signal.

12. The apparatus of claim 11, further comprising a common-mode detector circuit that is arranged to detect a common-mode signal associated with at least one of the first and second nodes.

13. The apparatus of claim 1, further comprising a third current source that is coupled to the first node, a fourth current source that is coupled to the second node, and a trim adjustment circuit that is coupled to at least one of the first and second nodes, wherein the trim adjustment circuit is arranged to compensate for matching errors in the apparatus, and wherein the third and fourth current sources are arranged to provide biasing currents when the differential input signal is low.

14. An apparatus that is arranged to provide a differential amplified signal in response to a differential input signal that is provided across first and second input terminals, comprising:
   a first resistor that is coupled between the first input terminal and a first node;
   a second resistor that is coupled between the second input terminal and a second node;
   a first current source that is coupled between a third node and a power supply, wherein the first current source is configured to respond to a drive signal;
   a second current source that is coupled between a fourth node and a power supply, wherein the second current source is configured to respond to the drive signal;
   a first amplifier circuit that is arranged to provide the drive signal in response to a common-mode sense signal, wherein the common-mode sense signal is associated with a common-mode portion of the differential input signal;
   a switching circuit that is arranged to selectively couple the first node to the third node in a first operating phase, selectively couple the first node to the fourth node in a second operating phase, selectively couple the second node to the fourth node in the first operating phase, and selectively couple the second node to the third node in the second operating phase; and a second amplifier circuit that is coupled to the first and second nodes, and arranged to provide the differential amplified signal.

15. The apparatus of claim 14, further comprising: a second switching circuit that is arranged to chop the differential output of the second amplifier circuit to provide the differential amplified signal.

16. An apparatus that is arranged to provide an amplified signal in response to an input signal that is provided across first and second input terminals, comprising:

a first resistive means that is arranged to couple a first level shifted signal to a first node;

a second restive means that is arranged to couple a second level shifted signal to a second node;

a first current source means that is arranged to cooperate with the first resistive means, wherein the first current source means is responsive to a drive signal;

a second current source means that is arranged to cooperate with the second resistive means, wherein the second current source means is responsive to a drive signal;

a drive means that is arranged to provide the drive signal in response to at least one of a reference signal and a common-mode sense signal; and an amplification means that is arranged to amplify signals associated with at least one of the first and second nodes to provide the amplified signal.

17. The apparatus of claim 16, further comprising a trim adjustment means that is arranged to adjust an offset associated with the apparatus.

18. The apparatus of claim 16, further comprising a third current source means that is arranged to provide a biasing current to the first node, and a fourth current source means that is arranged to provide another biasing current to the second node.

19. The apparatus of claim 18, further comprising a dynamic biasing means that is arranged to adjust the biasing currents in response to the drive signal such that the biasing currents are inversely proportional to a common-mode level associated with the differential input signal.

20. The apparatus of claim 16, further comprising a switching means that is arranged to shift the low frequency offsets of the apparatus to a higher frequency band.

* * * * *

UNITED STATES PATENT AND TRADEMARK OFFICE
CERTIFICATE OF CORRECTION

PATENT NO.    : 6,819,170 B1
DATED         : November 16, 2004
INVENTOR(S)   : Willem Johannes Kindt It is certified that error appears in the above-identified patent and that said Letters Patent is hereby corrected as shown below:

Column 3,
Line 43, "(A1)" should read -- (A1) --.
Line 47, "by;" should read -- by: --.

Column 7,
Line 34, "(152)" should read -- (I52) --.
Line 34, "152" should read -- I52 --.
Line 37, "(151)" should read -- (I51) --.
Line 38, "151" should read -- I51 --.

Column 11,
Line 16, "restive" should read -- resistive --.

Signed and Sealed this

Twenty-first Day of June, 2005

JON W. DUDAS
*Director of the United States Patent and Trademark Office*